United States Patent [19]

Lee et al.

[11] Patent Number: 5,369,057

[45] Date of Patent: Nov. 29, 1994

[54] METHOD OF MAKING AND SEALING A SEMICONDUCTOR DEVICE HAVING AN AIR PATH THERETHROUGH

[75] Inventors: Han-Sheng Lee, Bloomfield Hill, Mich.; Steven E. Staller; James H. Logsdon, both of Kokomo, Ind.; Dan W. Chilcott, Sharpsville, Ind.

[73] Assignee: Delco Electronics Corporation, Kokomo, Ind.

[21] Appl. No.: 169,118

[22] Filed: Dec. 21, 1993

[51] Int. Cl.$^5$ .................................... H01L 21/60
[52] U.S. Cl. .................................... 437/209; 437/214; 437/216; 437/219; 73/517 AV; 29/621.1
[58] Field of Search .............. 437/209, 216, 219, 212, 437/213, 214, 7, 8, 921; 73/517 AV; 29/621.1

[56] References Cited

U.S. PATENT DOCUMENTS

| | | | |
|---|---|---|---|
| 4,706,374 | 11/1987 | Murakami | 437/921 |
| 4,930,043 | 5/1990 | Wiegand | 73/517 AV |
| 5,006,487 | 4/1991 | Stokes | 73/517 AV |
| 5,068,203 | 11/1991 | Logsdon et al. | 437/921 |

FOREIGN PATENT DOCUMENTS

| | | | |
|---|---|---|---|
| 1195368 | 8/1989 | Japan | 73/517 AV |
| 1245163 | 9/1989 | Japan | 73/517 AV |

OTHER PUBLICATIONS

J. B. Lasky, "Wafer Bonding For Silicon-on-Insulator Technologies," Appl. Phys. Lett., 48 (1), 78, 1986.
R. Stengle, K. Y. Ahn and U. Gosele, "Bubble-Free Silicon Wafer Bonding in a Non-Cleanroom Environment," Jpn. J. Appl. Phys., 27, L2384, 1988.
W. P. Massara, G. Goetz, A. Caviglia and J. B. McKitterrick, "Bonding of Silicon Wafers for Silicon-on-Insulator," J. Appl. Phys., 64 (10), 4943, 1988.
K. Mitani and U. Gosele, "Wafer Bonding Technology for Silicon-on-Insulator Applications: A Review," J. Electronic Matl., 21, 669, 1992.
G. G. Goetz, "Semiconductor Wafer Bonding: Science, Technology, and Applications," p. 65, Ed. by W. Gosele, T. Abe, J. Haisoa and M. A. Schmidt, The Electrochemical Society, 1992.
E. Chason and T. M. Mayer, "Low Energy Ion Bombardment Induced Roughening and Smoothing of SiO$_2$ Surfaces".

Primary Examiner—Brian E. Hearn
Assistant Examiner—Kevin M. Picardat
Attorney, Agent, or Firm—Cary W. Brooks; Jimmy L. Funke

[57] ABSTRACT

This invention generally relates to the provision of a vent path during the bonding of silicon wafers and the subsequent encapsulation of the individual devices. A double-sided polished silicon wafer is used for the device wafer. The device wafer includes circuitry, thin membranes and metal interconnections. When bonding a bottom wafer to the device wafer, a vented path exists between the wafers. The venting path includes serpentine shape channel formed by interdigitated fingers and cavities. The cavity and the interdigitated patterns can be etched either together or separately into either wafer. A top wafer has a cavity formed therein. When the top device and bottom wafers are bonded together, the venting path is sealed by dipping the device in a sealing liquid. The serpentine path prevents the sealing liquid from reaching the cavity.

6 Claims, 5 Drawing Sheets

METHOD OF MAKING AND SEALING A SEMICONDUCTOR DEVICE HAVING AN AIR PATH THERETHROUGH

FIELD OF THE INVENTION

This invention relates to a method of making a semiconductor device, and more particularly to a method of making a semiconductor device having a serpentine air or venting path and sealing the same.

BACKGROUND

Accelerometers are often packaged by bonding silicon wafers together wherein a first wafer contains a thin membrane supporting a proof mass and two capping wafers, one on top and one at the bottom which have cavities formed therein to accommodate and restrict movement of the proof mass and provide damping during operation of the accelerometer. The bottom wafer also has holes etched through the wafer or channels formed therein extending from opposed sides of the wafer and communicating with the cavity. After the first and the bottom wafer have been bonded together, plasma etching is utilized for freeing and suspending the proof mass. During the etching step, if there were no vent path between bonded wafers the thin membrane ruptures due to the presence of gases trapped during the bonding process. With a vent path, the gases are vented through the channels or through the holes and out of the wafers. The channels must thereafter be sealed to avoid contaminants getting into the cavity. Some prior sealing method may result in the sealing material entering the cavity and obstructing the movement of the proof mass. Thus, there has been a need for a method of making and reliably sealing an accelerometer so that the sealing material does not obstruct the movement of the proof mass.

SUMMARY OF THE INVENTION

This invention generally relates to the provision of a vent path during the bonding of silicon wafers and the subsequent encapsulation of the individual devices. A double-sided polished silicon wafer is used for the device wafer. The device wafer includes circuitry, thin membranes and metal interconnections. When bonding a bottom wafer to the device wafer, a vented path exists between the wafers. The venting path includes a serpentine shape channel formed by interdigitated fingers and cavities. The cavity and the interdigitated patterns can be etched either together or separately into either wafer. After the wafers are bonded together, the venting path is sealed by dipping the device in a sealing material, composition or gel. The serpentine path prevents the sealing material from reaching the cavity for the proof mass.

These and other objects, features and advantages of the instant application will become apparent from the following brief description of the drawings, detailed description and appended claims and drawings.

DETAILED DESCRIPTION

Figure 1:
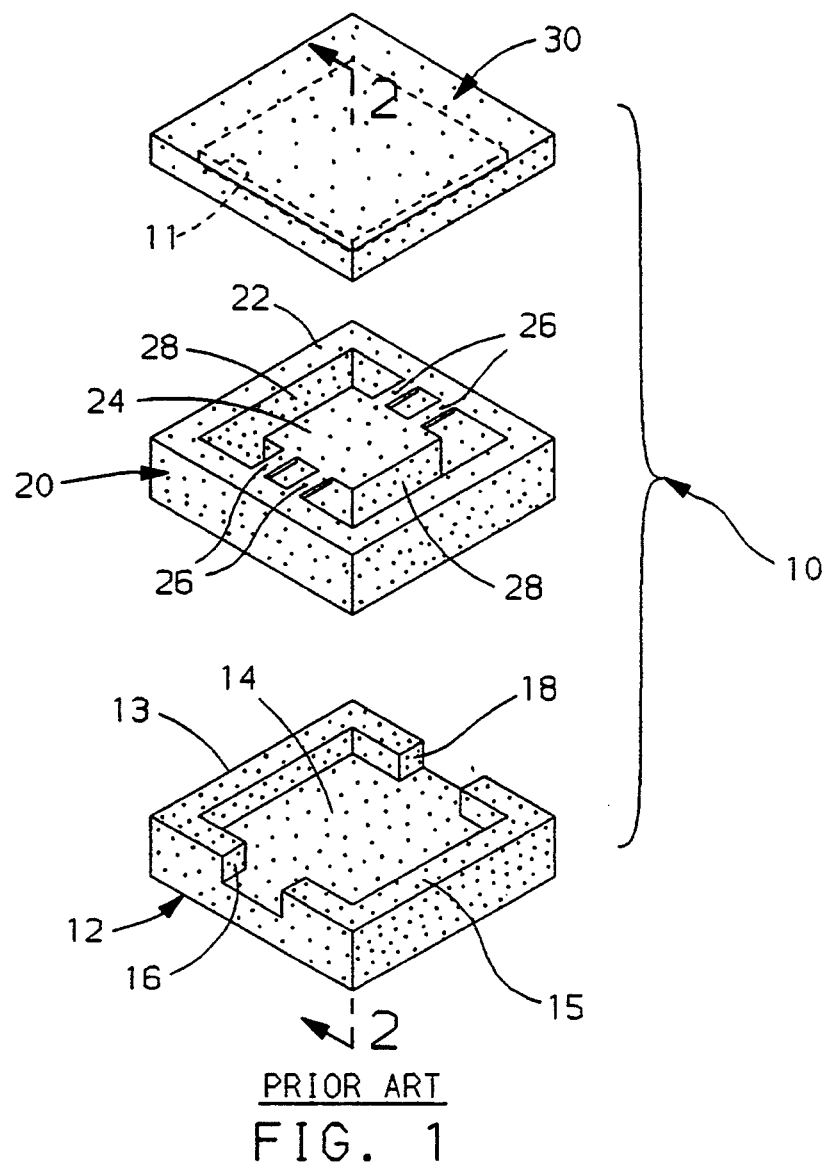
FIG. 1 illustrates a bottom wafer which defines an air path, a device wafer of a prior art accelerometer and a top capping wafer.

As illustrated in FIG. 1, an accelerometer 10 is composed of a bottom silicon wafer 12, a middle silicon wafer 20 and a top silicon wafer 30. Wafer 12 has a pair of opposed shoulders 13, 15 defining a central cavity 14 and opposed channels 16, 18 formed in the wafer and communicating with the central cavity 14 for the passage of air or gases. The central cavity 14 and opposed channels 16, 18 can be formed by selectively etching the wafer. A middle silicon wafer 20 includes support shoulders 22 and a proof mass 24 which are connected together by thin bridges 26 and a thin membrane (not shown) which extends between the support structure, proof mass and bridge where cavity 28 in FIG. 1 is formed. The support shoulders, bridges, proof mass and thin membrane are also formed by selectively etching the middle silicon wafer. The bridges 26 have resistors (not shown) formed thereon which are used to correlate the amount of deflection of the proof mass. Four bridges are shown in FIG. 1. However, the number of bridges can be reduced to one, i.e., the bridge and the proof mass can form a cantilever. At a predetermined deflection of the proof mass, an electric signal is sent to activate items such as air bags upon extreme acceleration. Often, the front side of the wafer 10 contains circuitry (not shown) connected to the resistors on the bridges for detecting movement of the proof mass and sending the associated signal. The cavity 14 formed in the lower wafer 12 and the cavity 11 formed in the upper wafer 30 allow a clearance for movement and damping of the proof mass 24.

Figure 8A:
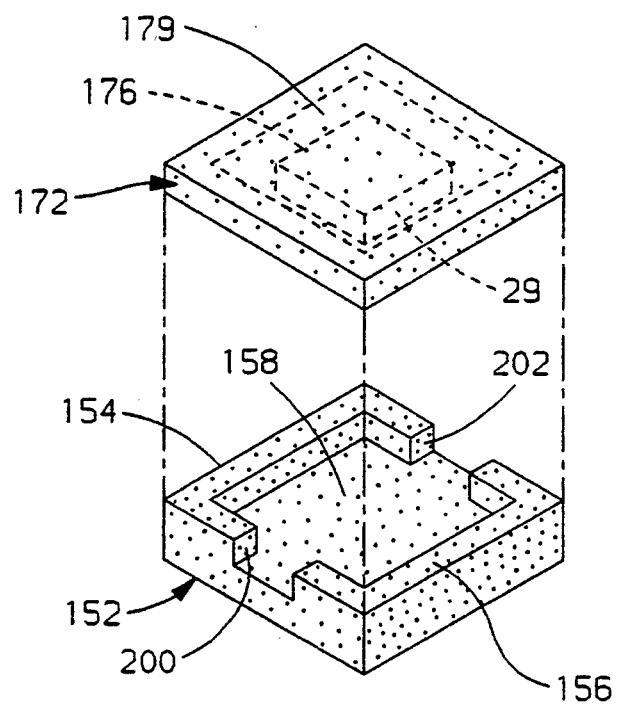
FIGS. 8a–8c are enlarged views of a bridge-supported accelerometer structure and illustrating steps of making the same according to the present invention.
Figure 8B:
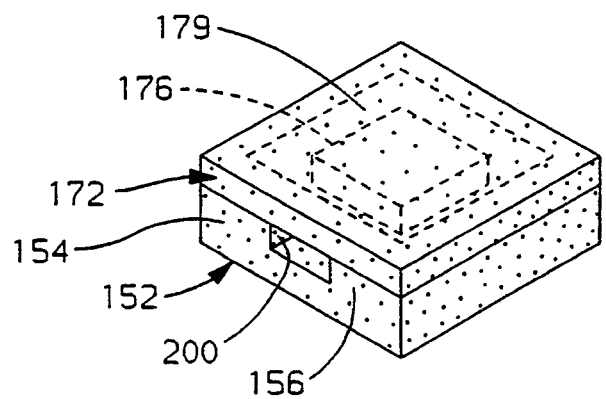
Figure 8C:
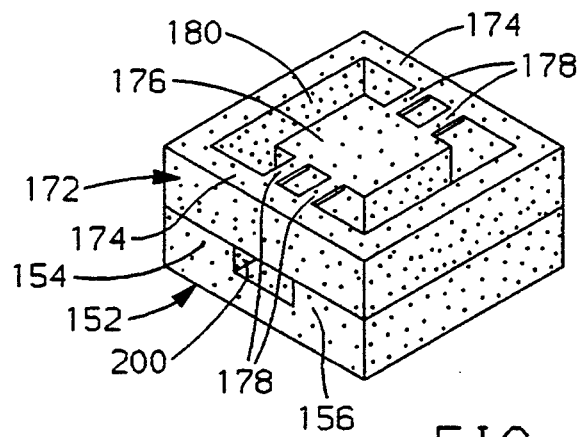

The wafer 20 which includes the proof mass 24 (FIG. 1) is very difficult to handle without destroying once the bridges have been formed. A solution according to the present invention is described hereafter when reference is made to FIGS. 8a–8c.

Figure 2:
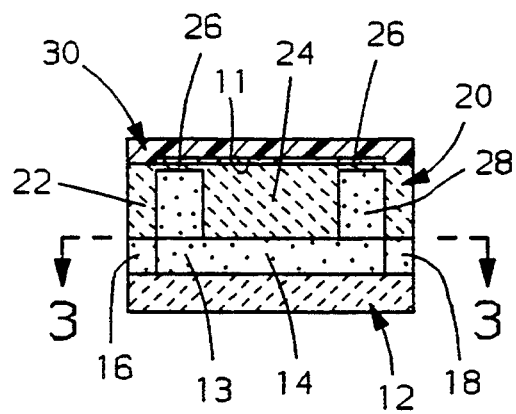
FIG. 2 is a sectional view taken along line 2—2 of FIG. 1, and illustrating a slit in the prior art accelerometer.
Figure 3:
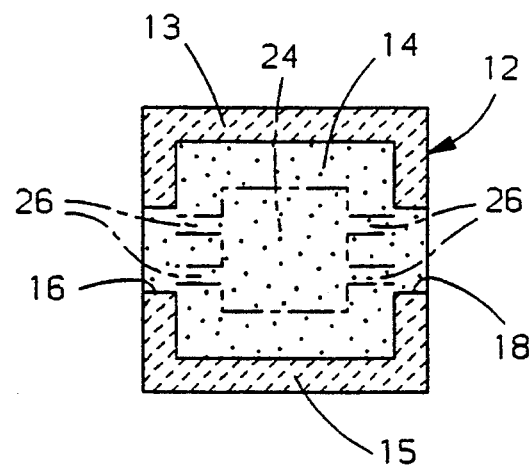
FIG. 3 is a sectional view taken along line 3—3 of FIG. 2, and illustrating the relationship of the bottom wafer cavity and the suspended proof mass (shown in phantom lines)

FIG. 2 is a side view taken along line 2—2 of FIG. 1 and illustrating a slit 16 (which is the same as channels 16, 18) which is left after the top and bottom wafers have been bonded together. This slit could cause reliability problems due to contaminants entering in the slit and being trapped inside the cavity. If an encapsulation material is used to fill the slit, the encapsulation material may enter the central cavity 14 and affect the reliability, accuracy and performance of the accelerometer. Thus, there has been a need for a method of wafer bonding and sealing silicon die that overcomes the disadvantages of the prior art.

Figure 4:
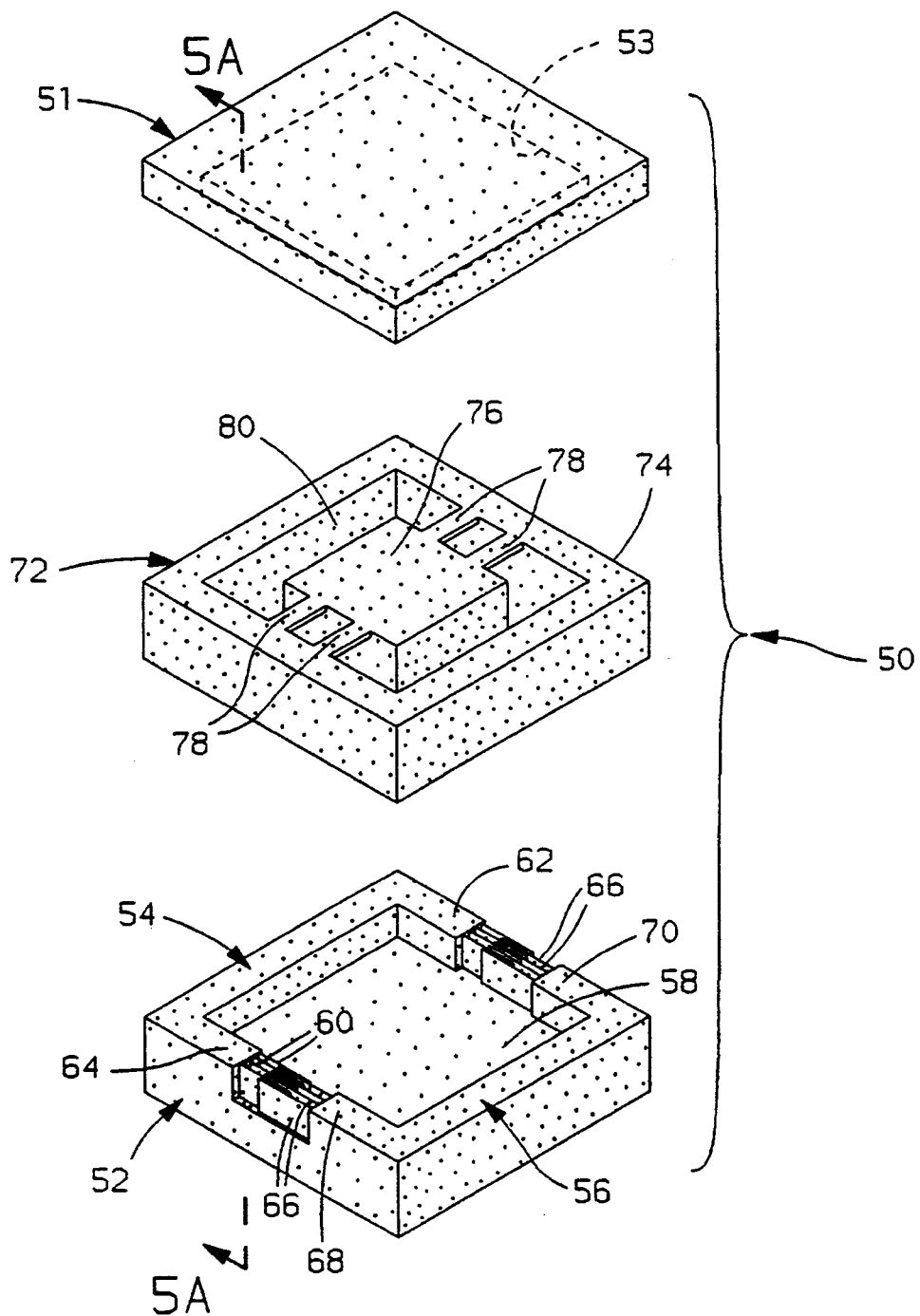
FIG. 4 illustrates the bottom, middle and top wafers of a device according to the present invention including a venting path formed by interdigitated fingers.
Figure 5A:
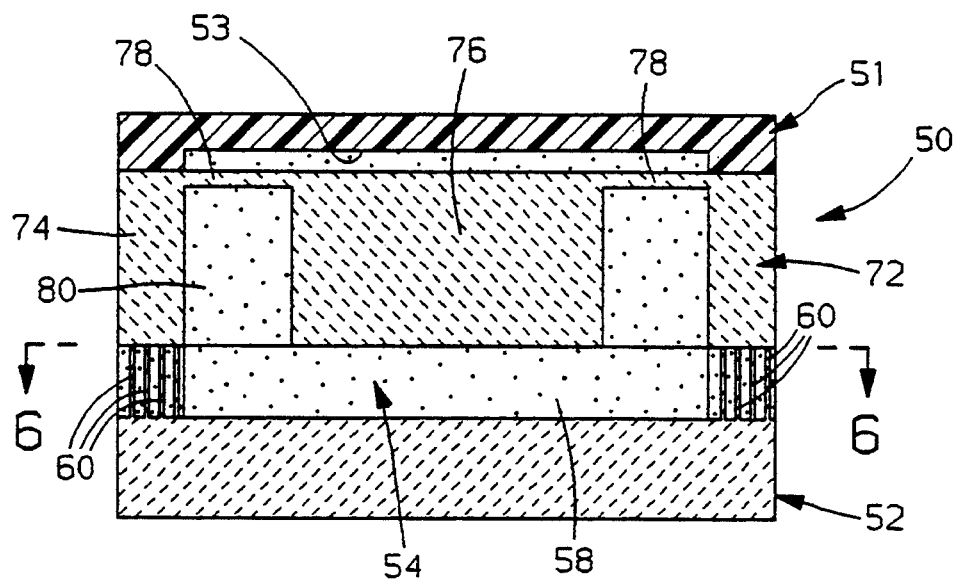
FIG. 5(A) is a sectional view taken along line 5—5 of FIG. 4.
Figure 6:
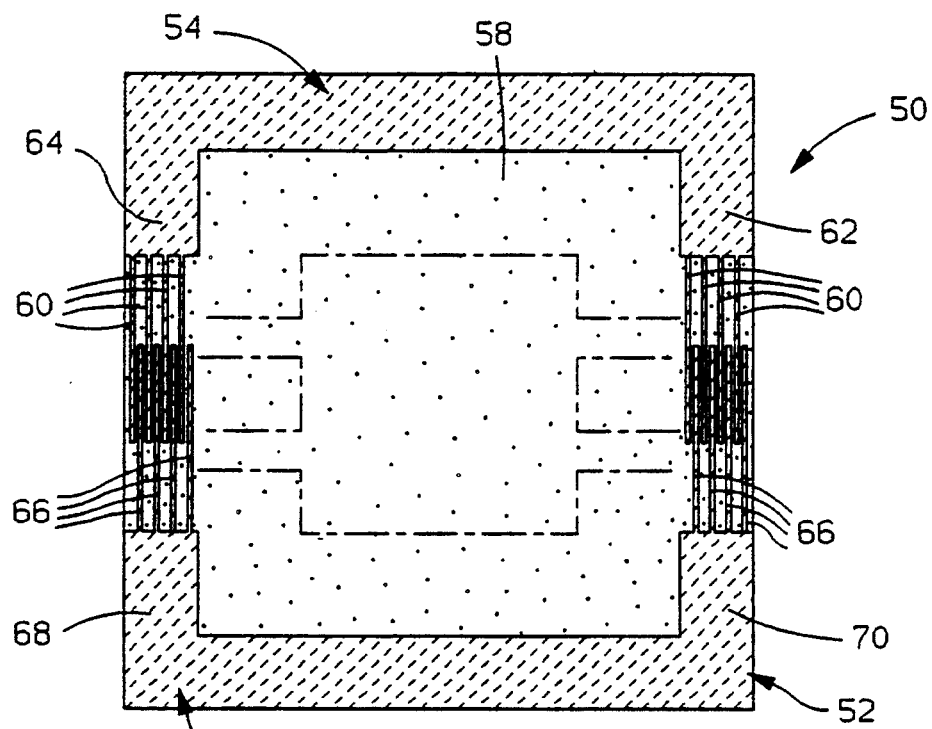
FIG. 6 is a sectional view taken along line 6—6 of FIG. 5(A) and illustrating interdigitated fingers, and the relationship of the bottom wafer cavity and the suspended proof mass according to the present invention.

As illustrated in FIGS. 4, 5(A) and 6, a device according to the present invention, such as an accelerometer 50, is composed of a top wafer 51, device wafer 72 and bottom wafer 52. The bottom silicon wafer 52 has a pair of first and second opposed U-shaped shoulders 54, 56 respectively defining a central cavity 58 with serpentine vents formed by a set of interdigitated fingers 60, 66 for the passage of air.

Figure 5B:
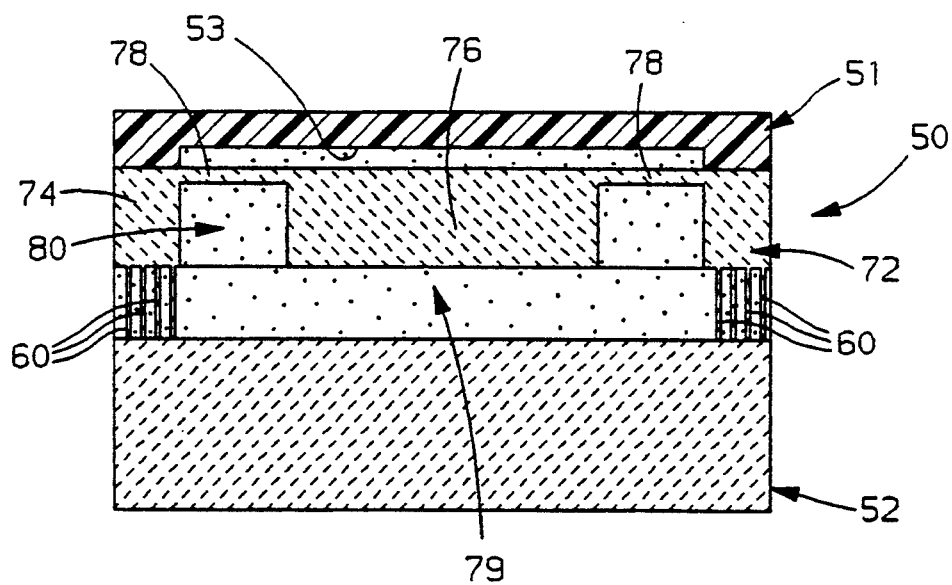
FIG. 5(B) is a sectional view of a variation of the bonded wafers, where a cavity and serpentine structure were formed on the backside of the device wafer.

The first set of spaced apart fingers 60 extend outwardly from the first U-shaped shoulder 54 at each end 62, 64 towards the second shoulder 56. Likewise, the second set of spaced apart fingers 66 extend outwardly from the second U-shaped shoulder 56 at each end 68, 70. The associated set of spaced apart fingers from each shoulder overlap to provide interdigitated fingers at opposed sides of each device that provide a serpentine air path communicating with the central cavity 58. Thus, a complete air path is provided from one side of the bottom wafer through a first set of interdigitated fingers, through the central cavity, through a second set of interdigitated fingers, and repeating this pattern to the opposite side of the wafer. The central cavity and the interdigitated fingers or serpentine path can be formed at the same time by selectively etching the lower silicon wafer. It is important to form a vent path between wafers 52 and 72 with a serpentine structure as a barrier for the sealing material used in the final packaging. The etched depth of the serpentine structure can be different from the depth of the cavity. The serpentine structure and the cavity do not have to be on the same wafer. One can be on the bottom wafer and the other on the back side of the device wafer, as long as they are connected and communicate with each other to form a continuous vent path. As shown in FIG. 5(B), a variation would be to incorporate the serpentine structure and the recessed proof mass on the backside of the device wafer. Patterning of the bottom capping wafer and subsequent wafer-to-wafer alignment would not be required. A middle silicon wafer 72 includes a rectangular-shaped support structure 74 and a proof mass 76 which is connected to the support structure by thin membrane bridges 78. As described above, a thin membrane which extends between the rectangular shaped support structure 74, proof mass 76 and bridges 78 so that the middle wafer can be handled without breaking the bridges 78. When the wafers are bonded together, the membrane is removed to form a cavity 80 between the rectangular support structure 74, proof mass 76 and bridges 78. The bridges have resistors (not shown) formed thereon which are used to measure the amount of deflection of the proof mass. At a predetermined deflection of the proof mass, an electronic signal is sent to activate items such as air bags upon extreme acceleration in an automobile. The front side of the device wafer has circuitry connected to the resistors formed on the thin membrane bridges for detecting movement of the proof mass and sending an associated signal to activate devices such as the air bag. The cavities 53, 58 formed both in the upper and lower silicon wafers respectively allow a clearance for movement and damping of the proof mass. In FIG. 5(B), the cavity 53 of the top wafer and the cavity 79 of the device wafer allow a clearance for movement and damping of the proof mass.

Figure 7:
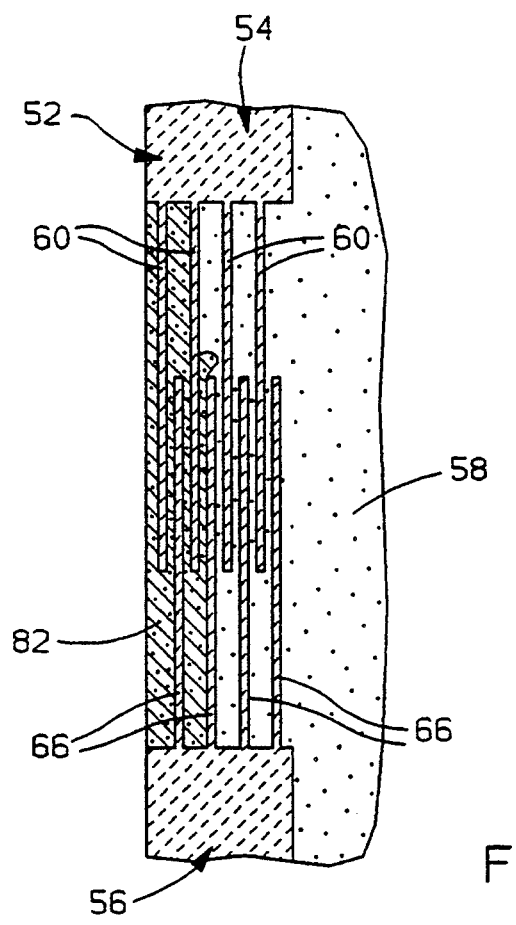
FIG. 7 is an enlarged, partial view of the bottom wafer illustrating the interdigitated fingers with an encapsulation material filling some of the gaps between the interdigitated fingers.

The bottom, middle and top silicon wafers may be bonded together by any of a variety of methods known to those skilled in the art and also by the method described hereafter. Once bonded together and sawn into die, the device may be sealed by a dielectric material or encapsulation material 82 such as epoxy, super glue or a silicon composition such as SYLGARD ™ (available from Dow Corning Corporation). This can be accomplished by simply dipping the bonded chips into the sealing material and heating them to have the sealing material cured. The serpentine path formed by the interdigitated fingers prevents the sealing composition from flowing into the central cavity and obstructing the movement of the proof mass. Usually, seepage or movement of the sealing material through the serpentine path is naturally stopped approximately in the middle of the serpentine path formed by the interdigitated fingers as shown in FIG. 7.

As indicated above, the silicon wafers may be bonded together by a variety of techniques. Using the structure shown in FIG. 4, a first wafer which has the circuitry, thin membranes and metal connections for the accelerometer will hereafter be referred to as the device wafer. A second wafer which has the venting cavities formed in it will be referred to as the bottom wafer.

Generally, a double-sided polished silicon wafer is used for the device wafer. After the necessary process steps, circuits with interconnect metal and membranes are formed on the device wafer. It is preferred to have a uniform layer of silicon dioxide on the backside of the wafer. The device wafer could be then placed into a plasma chamber to have the front side coated with a conformable film of pinhole free silicon nitride with thicknesses on the order of a few hundred nanometers at temperatures below 350° C. The bottom wafer contains the patterned venting cavity and a uniform thermally grown silicon dioxide on the front side of the wafer. The thickness of the oxide on the device wafer and the bottom wafer may range from a few tenths of nanometers to a couple hundred of nanometers. The two wafers are cleaned, rinsed, dried, and rinsed again with 18 megaohm-cm of deionized water. Typically the wafers are rinsed for about 240 seconds and are spun dried for about 100 seconds. The two wafers are put into a reactive ion etching (RIE) chamber with the sides to be bonded facing the plasma.

The wafers are etched by the RIE to smooth and make surfaces hydrophilic. Once the plasma is ignited, the thin layer of moisture left on the wafers after removing them from the dryer helps the lateral flow of impinging ions and also avoids the ion charging effects which can consequently damage the electrical integrity of the oxide. It is important not to have high energy ions bombarding the wafer surfaces and creating damage. A low power should be utilized during the RIE step. Typical power density used for the etching is about 60 mW/cm$^2$ with a plasma potential of about $-50$ V. The gases used to generate the plasma are chemically inactive at room temperature, such as oxygen, argon or the mixture of the two. A variety of plasma potentials may be utilized, however, it has been found plasma potentials more negative than $-100$ V result in damage to the wafer surfaces and lower wafer bonding strength is achieved. Argon, oxygen and mixtures of argon and oxygen may be utilized for the reactive ion etching. Chamber pressure of about 15 to about 20 milli Torr is suitable for the etching.

After smoothing the surfaces, the wafers are put into a chemical solution to create hydrophilic surfaces. The solution used is a mixture of $H_2O_2$:$NH_4OH$:deionized water in a ratio of 1:2:3 by volume which is heated to a temperature between 50° to 57° C. The wafers are immersed in the solution for approximately 15 minutes. The silicon nitride coating on the front side of the device wafer will protect the metal interconnects from attack by the chemical solution. If there is no silicon nitride coating on the front side of the device wafer, the wafer does not need to be in the 1:2:3 solution.

The wafers are then rinsed in deionized water to remove the chemical residues and then are put into a rinser and dryer to clean and dry the wafers. Typically, the wafers are rinsed for about 120 seconds and are dried for 80 seconds so that some moisture is still left on the wafers. The wafers are then put together and aligned for bonding. The wafers are left together in the aligned position for approximately an hour with or without a dead weight on them. The wafers are then placed in a furnace for bonding strength enhancement. The bonding enhancement step can be conducted at a temperature from about 100° to 480° C. for 30 minutes to an hour. The higher the temperature the shorter the time needed. After finishing all the steps, the typical tensile bonding strength is about 50 kg/cm². Thus, according to the present invention, a silicon wafer for bonding process at a temperature below 500° C. is accomplished with suitable tensile bonding strength. This is advantageous because metal interconnects such as aluminum are used in the devices wafer, and because the aluminum/silicon eutectic temperature is around 570° C. Thus, the present process overcomes the problems of prior art silicon wafer bonding processes where adhesives were used to glue wafers together.

The wafer 20 (FIG. 1) which includes the proof mass 24 is very difficult to handle without destroying once the bridges 26 have been formed. This difficulty is overcome by using a new process according to the present invention which combines backside bulk micromachining, front side plasma etching, and wafer to wafer bonding. A first wafer 172 (FIG. 8a) is bulk micromachined to provide a proof mass 176 supported on all sides by a thin membrane 179 which has the same thickness as the desired bridge thickness. The thin membrane 179 (where cavity 180 is formed) helps to make the structure more robust prior to bonding to the bottom silicon wafer. The first wafer 172 (FIG. 8a) is then bonded to the bottom wafer 152 which has a cavity 158 defined by opposed U-shaped shoulders 154, 156 and open channels 200, 202 communicating with the cavity 158 formed therein. This combination (FIG. 8b) provides a much less fragile structure than the first wafer alone. Plasma etching is then used to delineate bridges 178 (FIG. 8c) in the thin membrane so that the bridges extend from a support shoulder 174 to the proof mass 176. The cavity in the bottom wafer provides damping of the proof mass which reduces bridge breakage as portions of the thin membrane are etched away, leaving the final bridge-supported accelerometer structure. The fabrication can then be completed using the more robust structure provided by this new etch/bond/etch process.

The embodiments of the invention in which an exclusive property or privilege is claimed are defined as follows:

1. A method of making an accelerometer comprising:
providing a first wafer having a support shoulder and a proof mass suspended by a thin membrane bridge between the support shoulder and proof mass, and an associated circuitry for detecting deflection of the proof mass upon extreme acceleration,
providing a second wafer having a cavity formed therein, for accommodating the deflection of the proof mass of the first wafer,
at least one serpentine venting path formed in the at least one of said wafers;
bonding the first and second wafers together; and
exposing the bonded wafers to a sealing composition so that the sealing composition enters the serpentine venting path to seal the device.

2. A method as set forth in claim 1 wherein said serpentine venting path is formed by interdigitated finger.

3. A method as set forth in claim 2 wherein cavity and interdigitated finger are formed by selectively etching at least one of said wafers.

4. A method as set forth in claim 1 wherein the composition comprises an epoxy.

5. A method as set forth in claim 1 wherein the composition comprises a dielectric material.

6. A method of making an accelerometer comprising:
forming a wafer comprising silicon and including a proof mass suspended by at least one thin bridge extending between said proof mass and a support member defined in said wafer, and a thin membrane extending between said proof mass, bridge and support member;
forming a serpentine-shaped venting path in said accelerometer;
exposing said wafer to a plasma to remove said thin membrane and wherein said serpentine-shaped venting path is constructed and arranged to vent gases, associated with removing said thin membrane, out of the accelerometer; and
exposing said accelerometer to a sealing composition so that the sealing composition enters the serpentine venting path but does not extend all the way therethrough.

* * * * *